United States Patent [19]
Heck

[11] Patent Number: 4,748,425
[45] Date of Patent: May 31, 1988

[54] VCO RANGE SHIFT AND MODULATION DEVICE

[75] Inventor: Joseph P. Heck, Fort Worth, Tex.

[73] Assignee: Motorola, Inc., Schaumburg, Ill.

[21] Appl. No.: 16,024

[22] Filed: Feb. 18, 1987

[51] Int. Cl.[4] .............................................. H03C 3/22
[52] U.S. Cl. .................... 332/19; 332/30 V; 331/23; 331/36 C; 331/177 V
[58] Field of Search ............... 332/19, 30 V; 455/42, 455/76, 110, 113, 119; 331/23, 36 C, 177 V

[56] References Cited

U.S. PATENT DOCUMENTS

| | | | |
|---|---|---|---|
| 3,256,498 | 6/1966 | Hurtig | 332/30 V X |
| 3,328,727 | 6/1967 | Lynk, Jr. | 332/30 |
| 3,579,281 | 5/1971 | Kam et al. | 332/30 V |
| 4,330,758 | 5/1982 | Swisher et al. | 331/1 A |
| 4,375,621 | 3/1983 | Schneiter et al. | 332/30 V X |
| 4,378,534 | 3/1983 | Goedken et al. | 332/18 |
| 4,503,402 | 3/1985 | Englund, Jr. | 331/177 V X |
| 4,510,465 | 4/1985 | Rice et al. | 332/16 T |
| 4,630,008 | 12/1986 | Weeks | 332/30 V X |

Primary Examiner—Siegfried H. Grimm
Attorney, Agent, or Firm—Steven G. Parmelee

[57] ABSTRACT

A modulation and range shift device for use with a PLL frequency synthesizer VCO. The modulation signal is provided to the negative side of the tuning varactor (16) of the VCO (14). In addition, variable voltages can be applied to the negative side of the tuning varactor (16) to achieve range shift as desired. Component variations in the modulation section (18) need not be varied to accommodate changes in the loop filter (12 and 13) of the PLL circuit.

6 Claims, 2 Drawing Sheets

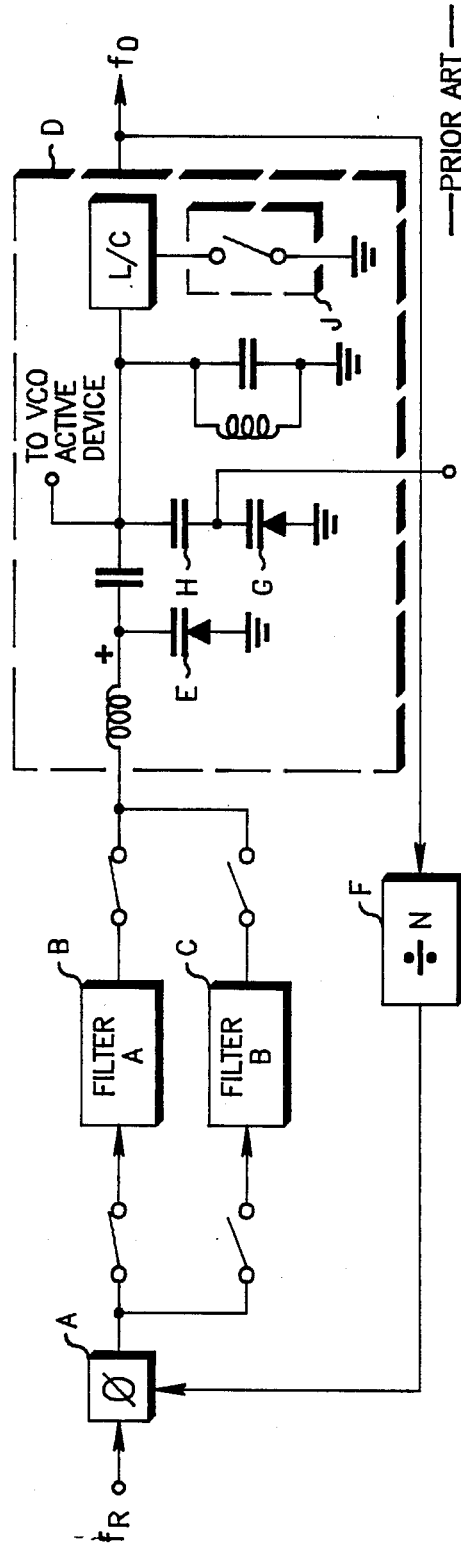
FIG. 1 — PRIOR ART
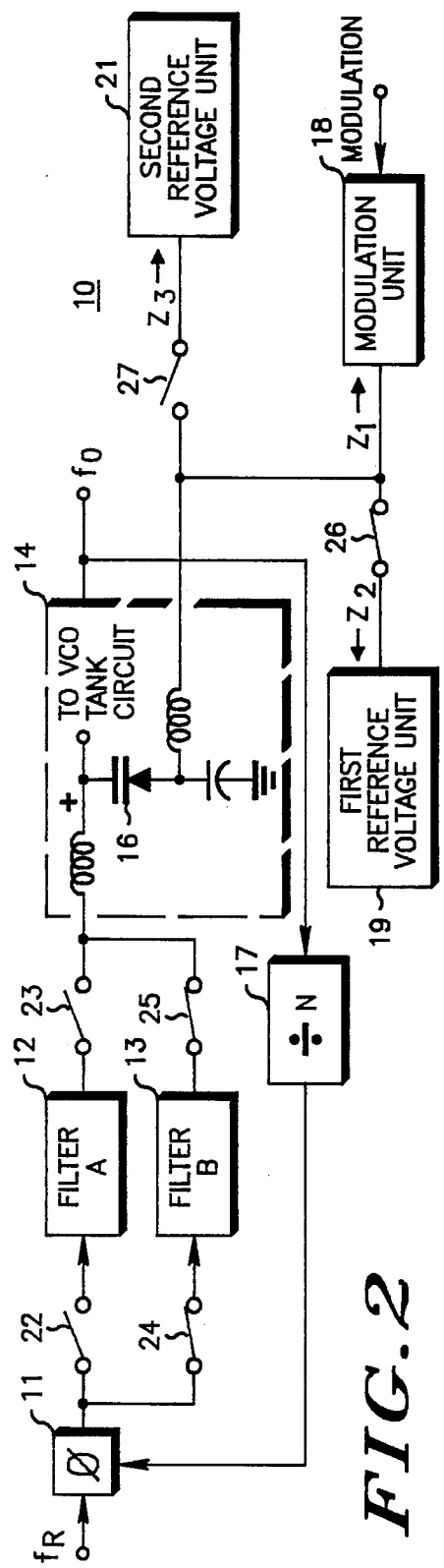
FIG. 2

VCO RANGE SHIFT AND MODULATION DEVICE

TECHNICAL FIELD

This invention relates generally to modulation of a VCO, and particularly to modulation of a VCO having range shift capabilities using negative varactor bias.

BACKGROUND ART

With reference to FIG. 1, frequency modulation two-way radios often use phase locked loop (PLL) frequency synthesizers to meet various transmission and reception needs in the radio, including creation of the modulated signal to be transmitted. Such PLL synthesizers typically include a phase detector (A) and may, depending upon the application, incorporate multiple loop filters (B and C) having different bandpass ranges. These multiple filters can be switched in and out of service as needed. The PLL also includes a voltage controlled oscillator (VCO) (D) that will ordinarily include a tuning varactor (E). Finally, a divide-by-N counter (F) will feedback the output of the VCO (D) to the phase detector (A) in accordance with well understood PLL technique.

Frequency modulation of the VCO (D) output can be achieved in a variety of ways. One common method employs a separate modulation varactor (G) lightly coupled to the VCO tank circuit through a capacitor (H) as shown in FIG. 1. A modulating voltage can be applied to the positive side of the modulation varactor (G) whose capacitance is thereby caused to vary with the modulating voltage, thus causing the resonant frequency of the VCO tank and the frequency of oscillation of the VCO (D) to vary with the modulating voltage. (Those skilled in the art of synthesizer modulation will realize that modulating the VCO alone will give a flat frequency response only for modulating frequencies above the bandwidth of the loop since the negative feedback action of the loop will tend to cancel the modulation at frequencies below the loop bandwidth. This invention does not address this aspect of frequency synthesizer modulation; it does, however, provide for obtaining flat frequency response for the VCO modulation port if operated in an open-loop mode, thus allowing truly flat response in the closed-loop mode when used in conjunction with means for obtaining flat closed-loop response, such as simultaneous modulation of the VCO and reference frequency.)

Prior art devices also often require a means of shifting the tuning range of the VCO (D). For example, a 20 Mhz band of frequencies might be split into two 10 Mhz ranges in order to keep the VCO steering line sensitivity lower and to allow lighter coupling of the main tuning varactor to the VCO tank in order to minimize the noise degradation caused by the typically low Q of the varactor. In the prior art shown in FIG. 1, range shifting is accomplished by switching in or out of the VCO tank an auxiliary inductance or capacitance (L/C) by means of a switching device (J) with suitable RF characteristics, such as a PIN diode.

There are problems associated with the above prior art techniques. One or more additional varactors and associated circuitry are required to accommodate the modulation technique. The PIN diode switching technique employed for range shifting requires a significant current draw increase in order to turn the diode "on", and also can cause a degradation of the VCO sideband noise due to the on-resistance of the PIN diode which degrades the Q of the VCO tank.

Accordingly, a need exists for a range shifting VCO in a PLL synthesizer that can provide a modulated output without requiring undue current draw, without undue noise degradation, and without requiring undue additional complexity and parts.

SUMMARY OF THE INVENTION

The above needs and others are substantially met through provision of the VCO range shift and modulation device described herein. This device functions in conjunction with a phase locked loop frequency synthesizer having a phase detector unit, a filter, a VCO having a tuning varactor, and a counter, all of which components cooperate with one another to produce a desired output signal having a desired frequency in accordance with well understood prior art technique.

In addition, the device provides for provision of a modulation unit to provide a modulation signal to the negative side of the VCO tuning varactor. In another embodiment, a steering line control unit can be added to allow selective variance of the negative varactor bias voltage to thereby allow the tuning range of the VCO to be selectively range shifted. This steering line control unit can include first and second reference voltage units for allowing selective provision of differing voltages, at substantially identical output impedances, to the negative side of the tuning varactor.

BRIEF DESCRIPTION OF THE DRAWINGS

These and other attributes of the invention will become more clear upon making a thorough review and study of the following description of the best mode for carrying out the invention, wherein:

FIG. 1 comprises a block diagram depiction of a prior art PLL frequency synthesizer;

FIG. 2 comprises a block diagram depiction of the invention; and

BEST MODE FOR CARRYING OUT THE INVENTION

Figure 3:
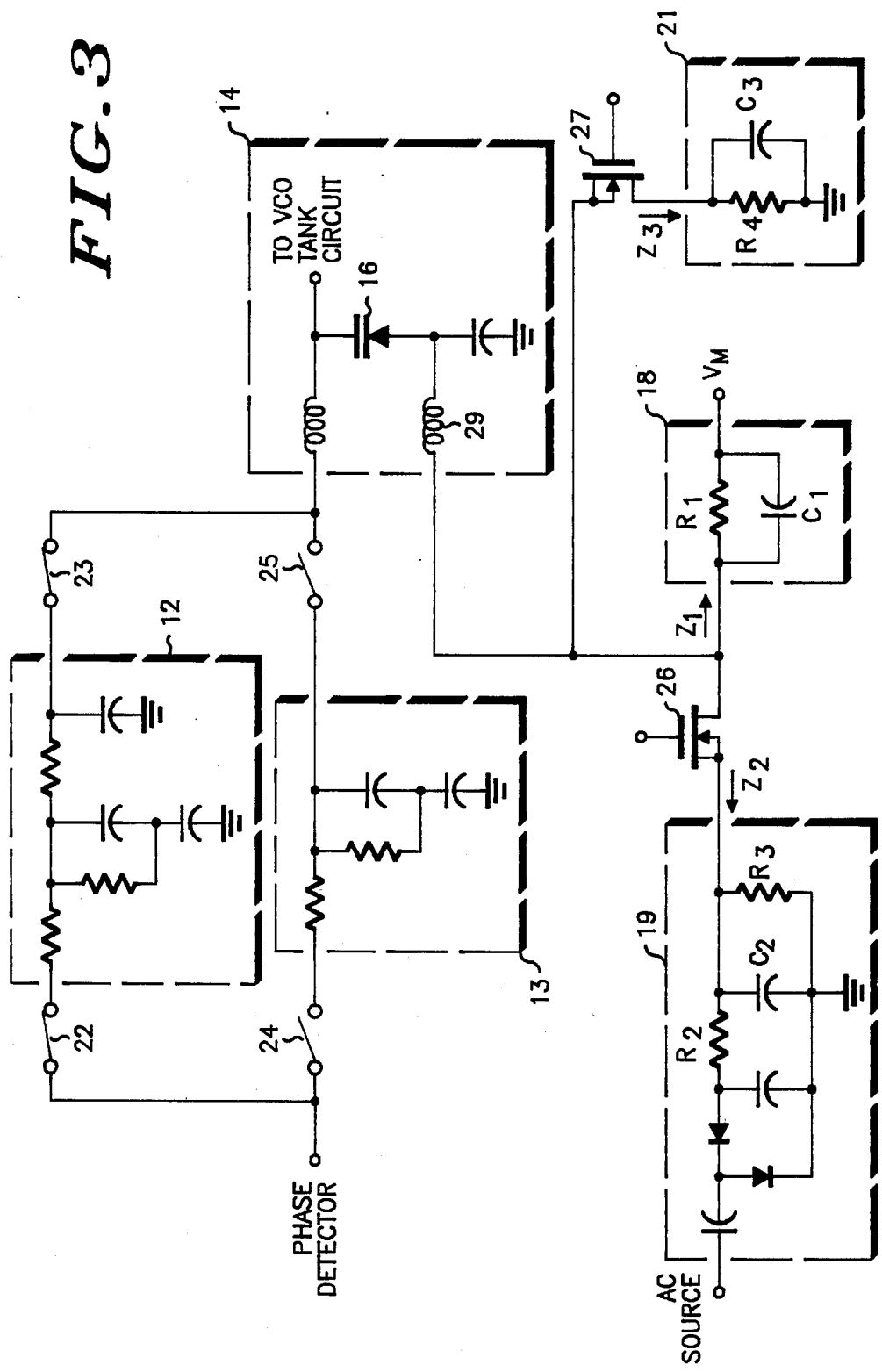
FIG. 3 comprises a more detailed schematic representation of the invention.

Referring now to FIG. 2, the invention can be seen as depicted generally by the numeral 10. The invention (10) includes generally a phase detector (11), a first and second filter (12 and 13), a VCO (14) having a tuning varactor (16), a counter (17), a modulation unit (18), and first and second reference voltage units (19 and 21). In addition, 4 switches (22-25) are configured in conjunction with the filters (12 and 13) and 2 switches (26 and 27) are configured in conjunction with the first and second reference voltage units (19 and 21).

The phase detector (11) receives a reference frequency ($f_R$) and the output signal of the counter (17). The phase detector (11) then provides an output signal related to any phase difference between these two input signals in accordance with well understood prior art technique, and this output signal is selectively provided to one or the other of the two filters (12 and 13) depending upon the conductive state of the 4 switches (22-25) associated therewith as determined by the operating needs of the system.

The output of the filter (12 or 13) then connects to the positive side of the varactor (16) in the VCO (14). The output of the VCO (14) comprises a signal having the desired output frequency ($f_O$), which signal is provided to the input of the counter (17) where it may be appropriately divided and provided to the phase detector (11) as described above.

The negative side of the tuning varactor (16) connects to the modulation unit (18), such that a modulation signal can be provided to the negative side of the tuning varactor (16) to thereby modulate the output signal of the VCO (14). The modulation unit (18) has an output impedance ($Z_1$) as described in more detail below.

The negative side of the tuning varactor (16) also connects through two appropriate switches (26 and 27) to the first and second reference voltage units (19 and 21). The first reference voltage unit (19) provides a first reference voltage, depending upon the conductive state of the switch (26) associated therewith, to the negative side of the tuning varactor (16), and has an output impedance ($Z_2$) as described in more detail below. Similarly, the second reference voltage unit, depending upon the conductive state of the switch (27) associated therewith, provides a second reference voltage signal to the negative side of the tuning varactor (16), and exhibits an output impedance ($Z_3$) as also described in more detail below.

Referring now to FIG. 3, a more detailed description of certain of the above components will now be provided.

Referring now to FIG. 3, the two filters (12 and 13) may be appropriately configured of resistors and capacitors as depicted, or of other components (active or passive) to provide the necessary filtering as appropriate to a given application. In the configuration depicted, the first filter (12) could be, for example, a wide band width filter, and the second filter (13) could be a narrow band width filter.

The modulation unit (18) can be comprised of a first resistor (R1) and a first capacitor (C1). The latter two components are configured in parallel and serve to couple a modulating signal having an amplitude ($V_M$) through an RF choke (29) to the negative side of the tuning varactor (16) of the VCO (14).

The first reference voltage unit (19) can essentially comprise a negative voltage source that connects to an AC source (such as, for instance, a 300 khz square wave source or other appropriate digitally generated signal) which provides an AC signal that can be rectified and filtered in accordance with well understood prior art technique. In addition, the first reference voltage source includes a second resistor (R2), a third resistor (R3), and a second capacitor (C2). The significance of the latter components will be made more apparent below.

Finally, the second reference voltage unit (21) can be comprised of a parallel configured fourth resistor (R4) and third capacitor (C3) that connect between ground and the switch (27) configured therewith.

The first reference voltage unit (19) has an output impedance ($Z_2$) that may be closely approximated by the relative impedances of R2, R3, and C2. In particular, the relevant output impedance ($Z_2$) is substantially defined by the impedance of R2 as viewed in parallel with the impedance of R3 in parallel with $1/SC_2$ (where S comprises the Laplace variable representing the variable impedance of $C_2$ in response to varying frequency conditions). The components of the second reference voltage unit (21) (R4 and C3) are chosen to substantially equal the relevant impedances of the first reference voltage unit (19). I.e., R4 will substantially equal the impedance of R2 in parallel with R3, and C3 will equal C2, such that the output impedance ($Z_3$) of the second reference voltage unit (21) will substantially equal the output impedance ($Z_2$) of the first reference voltage unit (19), even during varying frequency conditions.

The output impedance ($Z_1$) of the modulation unit (18) essentially comprises the output impedance of either the first or second reference voltage unit ($Z_2$ or $Z_3$) as multiplied by a scalar value. In other words, C1 of the modulation unit (18) has a value equal to either C2 or C3 as divided by the scalar value of choice (A), and R1 has a value equal to R2 in parallel with R3 as multiplied by the scalar value of choice (A).

A number of advantages are obtained through provision of the above configured device. By coupling the modulation to the negative side of the tuning varactor (16) as versus the positive side, the coupling network of the modulation unit (18) requires minimal parts and complexity and need not vary in component value in order to maintain a constant modulation sensitivity and flat frequency response when the loop filters (12 and 13) are changed during operation of the radio. Further, separate modulation varactors and associated peripheral components are obviated, since modulation is carried out with respect to the tuning varactor (16). Range shifting of the VCO tuning frequencies can be achieved without significant current drain or noise degradation, in part due to avoidance of a PIN diode switch technique.

Those skilled in the art will recognize that various modifications and changes could be made with respect to the above described invention, without departing from the general spirit and scope of the invention as set forth. Therefore, it should be understood that the claims are not to be considered as limited to the particular embodiments set forth in the absence of specific limitations expressly incorporating such embodiments.

I claim:

1. A modulation device comprising:
   (A) VCO means for providing an output signal, said VCO means comprising a tuning varactor having an anode and a cathode;
   (B) modulation means for providing a modulation signal to said anode of said VCO tuning varactor to cause modulation of said output signal; and
   (C) steering line control means for selectively varying negative varactor bias voltage to thereby allow said VCO means to be selectively range shifted, wherein said steering line control means includes:
      (i) first reference voltage means having a first output impedance for providing a first reference voltage; and
      (ii) second reference voltage means having a second output impedance for providing a second reference voltage, wherein said first and second output impedances are substantially identical and said first reference voltage is different from said second reference voltage.

2. A method of providing a modulated signal, comprising the steps of:
   (A) providing VCO means for providing an output signal, said VCO means comprising a tuning varactor having an anode and a cathode;
   (B) providing a modulation signal to said anode of said VCO tuning varactor to cause modulation of said output signal;
   (C) providing a first voltage to said anode of said tuning varactor when a first tuning range is desired; and (D) providing a second voltage, which second voltage is different from said first voltage, to said anode of said tuning varactor when a second tuning range is desired, said second tuning range being at least partially different from said first tuning range.

3. In a phase locked loop frequency synthesizer having:
   phase detector means for receiving a reference frequency signal and a divided output frequency signal and for providing a phase detector output signal related to any phase difference between said reference frequency signal and said divided output frequency signal;
   filter means for receiving said phase detector output signal and for providing a filtered signal in response thereto;
   VCO means having a tuning range for receiving said filtered signal and for providing an output frequency signal in response thereto, wherein said VCO means includes a tuning varactor having an anode and a cathode; and
   counter means for receiving said output frequency signal and for dividing said output frequency signal by a predetermined amount to thereby provide said divided output frequency signal;
   an improvement comprising:
      modulation means for providing a modulation signal to said anode of said VCO tuning varactor; and
      steering line control means for selectively varying negative varactor bias voltage to thereby allow said tuning range of said VCO to be selectively range shifted, wherein said steering line control means includes:
      (A) first reference voltage means having a first output impedance for providing a first reference voltage; and
      (B) second reference voltage means having a second output impedance for providing a second refrence voltage, wherein said first and second output impedances are substantially identical and said first reference voltage is different from said second reference voltage.

4. The improvement of claim 3 wherein said steering line control means includes:
   (A) first switch means for allowing said first reference voltage means to be selectively connected to said anode of said tuning varactor; and
   (B) second switch means for allowing said second reference voltage means to be selectively connected to said anode of said tuning varactor.

5. In a phase looked loop frequency synthesizer having:
   phase detector means for receiving a reference frequency signal and a divided output frequency signal and for providing a phase detector output signal related to any phase difference between said reference frequency signal and said divided output frequency signal;
   filter means for receiving said phase detector output signal and for providing a filtered signal in response thereto;
   VCO means having a tuning range for receiving said filtered signal and for providing an output frequency signal in response thereto, wherein said VCO means includes a tuning varactor having an anode and a cathode; and
   counter means for receiving said output frequency signal and for dividing said output frequency signal by a predetermined amount to thereby provide said divided output frequency signal;
   an improvement comprising:
      (A) modulation means for providing a modulation signal to said anode of said VCO tuning varactor, wherein said modulation means has a first output impedance; and
      (B) steering line control means for selectively varying negative varactor bias voltage to thereby allow said tuning range of said VCO to be selectively range shifted, wherein said steering line control means includes:
      first reference voltage means having a second output impedance for providing a first reference voltage; and second reference voltage means having a third output impedance for providing a second reference voltage, wherein said second and third output impedances are substantially identical to one another, said first output impedance substantially comprises a scalar multiple of said second and third output impedances, and said first reference voltage is different from said second reference voltage.

6. In a frequency synthesizer having a phase locked loop, which phase locked loop includes a voltage controlled oscillator having:
   a tuning range; and
   a tuning varactor having a first side and a second side, an improvement wherein:
   (A) said first side of said tuning varactor connects to said phase locked loop; and further including
   (B) modulation means for providing a modulation signal to said second side of said varactor; and
   (C) steering line control means for selectively varying varactor bias voltage to thereby allow said tuning range of said voltage controlled oscillator to be selectively range shifted.

* * * * *